(12) United States Patent
Kang et al.

(10) Patent No.: US 12,387,947 B2
(45) Date of Patent: Aug. 12, 2025

(54) LARGE-AREA HEATER

(71) Applicant: POWER CUBESEMI INC., Gyeonggi-do (KR)

(72) Inventors: Tai Young Kang, Gyeonggi-do (KR); Dong ju Kim, Incheon (KR); Young Sung Hong, Seoul (KR); Hyun Gi Kang, Seoul (KR)

(73) Assignee: POWER CUBESEMI INC., Gyeonggi-Do (KR)

( * ) Notice: Subject to any disclaimer, the term of this patent is extended or adjusted under 35 U.S.C. 154(b) by 818 days.

(21) Appl. No.: 17/634,779

(22) PCT Filed: Nov. 22, 2019

(86) PCT No.: PCT/KR2019/016185
§ 371 (c)(1),
(2) Date: Feb. 11, 2022

(87) PCT Pub. No.: WO2021/029493
PCT Pub. Date: Feb. 18, 2021

(65) Prior Publication Data
US 2022/0277969 A1 Sep. 1, 2022

(30) Foreign Application Priority Data

Aug. 13, 2019 (KR) .................. 10-2019-0099031

(51) Int. Cl.
*H01L 21/67* (2006.01)
*H10K 71/00* (2023.01)
*H10K 71/40* (2023.01)

(52) U.S. Cl.
CPC .. *H01L 21/67103* (2013.01); *H01L 21/67098* (2013.01); *H10K 71/00* (2023.02); *H10K 71/40* (2023.02)

(58) Field of Classification Search
CPC ......... H01L 21/67098; H01L 21/67103; H01L 21/67034; H10K 71/00; H10K 71/40; G02F 1/1333; G02F 1/133382
See application file for complete search history.

(56) References Cited

U.S. PATENT DOCUMENTS

| 6,351,105 | B2 | 2/2002 | Suzuki |
| 10,049,948 | B2 | 8/2018 | Gaff et al. |
| 2014/0154819 | A1* | 6/2014 | Gaff ........................ H01L 22/14 |
| | | | 156/345.52 |

FOREIGN PATENT DOCUMENTS

| JP | 2018181992 | 11/2018 |
| KR | 100713269 | 5/2007 |

(Continued)

*Primary Examiner* — Robert G Bachner
(74) *Attorney, Agent, or Firm* — Grossman, Tucker, Perreault & Pfleger, PLLC; Donald J. Perreault

(57) ABSTRACT

An embodiment of the present invention provides a large-area heater. The large-area heater comprises: a heating plate including a central area in which heat is concentrated and a peripheral area surrounding the central area; and a plurality of unit heaters for heating at least a part of the central area and at least a part of the peripheral area, wherein each of the plurality of unit heaters comprises: a plurality of heat emitting areas producing different amounts of heat; a plurality of power wires for independently transmitting power to the plurality of heating areas, respectively; and pairs of power terminals which are arranged at the corner of each of the unit heaters so as to supply power to the plurality of power wires, the number of pairs of power terminals corresponding to the number of the plurality of heat emitting areas.

8 Claims, 6 Drawing Sheets

(56) References Cited

FOREIGN PATENT DOCUMENTS

| | | |
|---|---|---|
| KR | 100824224 | 4/2008 |
| KR | 101136892 | 4/2012 |
| KR | 20140070494 | 6/2014 |
| KR | 101463614 | 11/2014 |
| KR | 101540654 | 8/2015 |
| KR | 20150077842 | 6/2020 |

* cited by examiner

LARGE-AREA HEATER

FIELD

The present invention relates to a heater for semiconductor manufacturing equipment.

BACKGROUND

A heater converts electrical energy into thermal energy. Typically, an oven for manufacturing semiconductors equipped with a heater is essential for the process of removing air bubbles from the adhesion between the glass substrate and the lower substrate in process of manufacturing a flexible OLED module, and is an important facility for managing the final yield of the OLED module. The heater is a main part in semiconductor equipment for controlling heat source, and it is required to enlarge heater modules due to the enlargement of OLED displays. When the heater module is enlarged, the difficulty of heat source control is reduced, and in particular, there is an effect of reducing the cost of parts.

However, when the heater module is enlarged, the thermal uniformity is lowered, and a heater pattern design and module assembly technology are required according to the area expansion. In particular, due to the combination of characteristics that semiconductor processes have many thermal processes and thermal process makes it difficult to control heat sources as the area increases, it becomes difficult to respond to equipment for manufacturing OLED display.

SUMMARY

It is intended to provide a large-area heater having a structure that is relatively easy to control a heat source.

There is provided a large-area heater. The large-area heater may include a heating plate having a central region to which heat is concentrated and a peripheral region surrounding the central region, and a plurality of unit heaters configured for heating at least a portion of the central region and at least a portion of the peripheral region. The plurality of unit heaters may include a plurality of heating regions configured for generating different amounts of heat, a plurality of power lines configured for independently transmitting power to each of the plurality of heating regions, and a plurality of power connection terminal pairs disposed at a corner of the unit heater to supply power to the plurality of power lines, wherein the number of the plurality of the power connection terminal pairs corresponds to the number of the plurality of heating regions.

In one embodiment, the heating region may include a single zone and a multi-zone having a plurality of sub-zones generating different amounts of heat. The plurality of sub-zones may be supplied with power through one power line.

In one embodiment, the plurality of unit heaters comprises left, right and vertically symmetrical heating regions.

In one embodiment, the unit heater may include a first heating region corresponding to the central region and a second heating region corresponding to the peripheral region. A pattern density of a heater pattern disposed in the first heating region may be smaller than a pattern density of a heater pattern disposed in the second heating region.

In one embodiment, the unit heater may include a first heating region corresponding to the central region and a second heating region corresponding to the peripheral region. A cross-sectional thickness of a heater pattern disposed in the first heating region may be different from a cross-sectional thickness of a heater pattern disposed in the second heating region.

In one embodiment, the heating region may include a heater pattern formed by electrically connecting a plurality of sub-patterns.

In one embodiment, the plurality of sub-patterns may include a first connector and a second connector, both having slit formed thereon and a sub heating element bent in a zigzag shape to have a plurality of bending points between the first connector and the second connector.

In one embodiment, a temperature deviation of the central region is adjusted by controlling a temperature of the second heating region corresponding to the peripheral region.

BRIEF DESCRIPTION OF THE DRAWINGS

Hereinafter, embodiments of the invention will be described with reference to the accompanying drawings. For the purpose of easy understanding of the invention, the same elements will be referred to by the same reference signs. Configurations illustrated in the drawings are examples for describing the invention, and do not restrict the scope of the invention.

DETAILED DESCRIPTION

Embodiments which will be described below with reference to the accompanying drawings can be implemented singly or in combination with other embodiments. But this is not intended to limit the present invention to a certain embodiment, and it should be understood that all changes, modifications, equivalents or replacements within the spirits and scope of the present invention are included.

Terms such as first, second, etc., may be used to refer to various elements, but, these element should not be limited due to these terms. These terms will be used to distinguish one element from another element.

The terms used in the following description are intended to merely describe specific embodiments, but not intended to limit the invention. An expression of the singular number includes an expression of the plural number, so long as it is clearly read differently. The terms such as "include" and "have" are intended to indicate that features, numbers, steps, operations, elements, components, or combinations thereof used in the following description exist and it should thus be understood that the possibility of existence or addition of one or more other different features, numbers, steps, operations, elements, components, or combinations thereof is not excluded.

Figure 1:
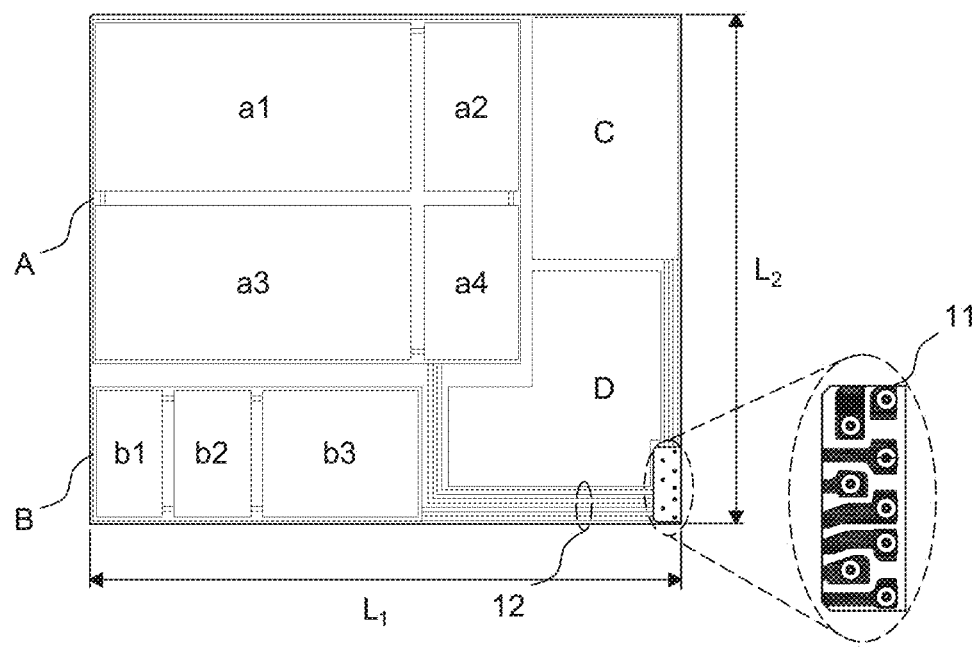
FIG. 1 exemplarily illustrates a unit heater constituting a large-area heater.

FIG. 1 exemplarily illustrates a unit heater constituting a large-area heater.

One large-area heater 100 (see FIG. 2) includes a plurality of unit heaters 10. The unit heater 10 includes a plurality of heater patterns attached to an insulating plate having a width $L_1$ and a length $L_2$. In one embodiment, the insulating plate may be a mica plate, but is not limited thereto. The insulating plate may include an upper insulating plate and a lower insulating plate, and a plurality of heater patterns may be interposed between the upper insulating plate and the lower insulating plate.

The unit heater 10 may include a plurality of heating regions A, B, C, and D. The heating region may be single zones C, D or multi-zones A, B. The single zone and the multi-zone may be formed by a plurality of heater patterns. The multi-zone may include a plurality of sub-zones, for example, a1, a2, a3, a4 in the heating region A, which receive power supplied through one power line 12. The heater pattern may be formed by coupling a plurality of sub-patterns. Each of the plurality of heating regions A, B, C, and D may generate a different amount of heat. The plurality of heating regions A, B, C, and D may be disposed to be spaced apart from each other by a certain interval for electrical and thermal insulation. On the other hand, a temperature sensor may be disposed for each heating region. A method of manufacturing each of the plurality of heating regions A, B, C, and D have different amounts of heat will be described in detail below with reference to FIGS. 5 and 6.

Each of the plurality of heating regions A, B, C, and D is powered by a single power supply. The power connection region 11 is located near one edge of the unit heater 10. In the power connection region 11, the same number of power connection terminal pairs as the number of heating regions are disposed. In the case of the unit heater 10 illustrated in FIG. 1, since there are four heating regions, four power connection terminal pairs are disposed in the power connection region 11. The power line 12 is disposed for each heating region without distinction between single zones and multi-zones. One end of the power line 12 is electrically coupled to the power connection region 11, and the other end is electrically coupled to the heating regions A, B, C, and D. That is, the power line may extend along the circumference of the unit heater 10 from the pair of power connection terminals. The power line 12 may be formed of the same material as the heater pattern, and therefore generate heat by the transmitted power.

Unlike single zones C and D, since each multi-zones A and B consist of a plurality of sub-zones, power supplied through the power line 12 is distributed to respective sub-zones within each multi-zone. In one embodiment, as illustrated in FIG. 1, each sub-zone may be coupled in series. In another embodiment, each sub-zone may be coupled to a sub power line (not shown) branched from the other end of the power line 12.

In the unit heater 10, the plurality of heating regions A, B, C, and D may be disposed in consideration of the temperature uniformity of the large-area heater 100 in which the plurality of unit heaters 10 are coupled. Compared to the case where the unit heater 10 is implemented with the same heater pattern (that is, the amounts of heat generated in all heating regions are the same), it is very difficult to control the temperature deviation that may occur on the unit heater 10 as well as the temperature deviation that occurs on the large area heater 100. On the other hand, in the structure of individually controlling each of the plurality of heating regions (that is, power control for each single zone and sub-zone), it is difficult to arrange the power line for transmitting power, and since it is necessary to provide a separate temperature controller for each zone, the manufacturing cost increases. The arrangement of the heating regions in consideration of temperature deviation control will be described in detail with reference to the large-area heater of FIG. 2.

Figure 2:
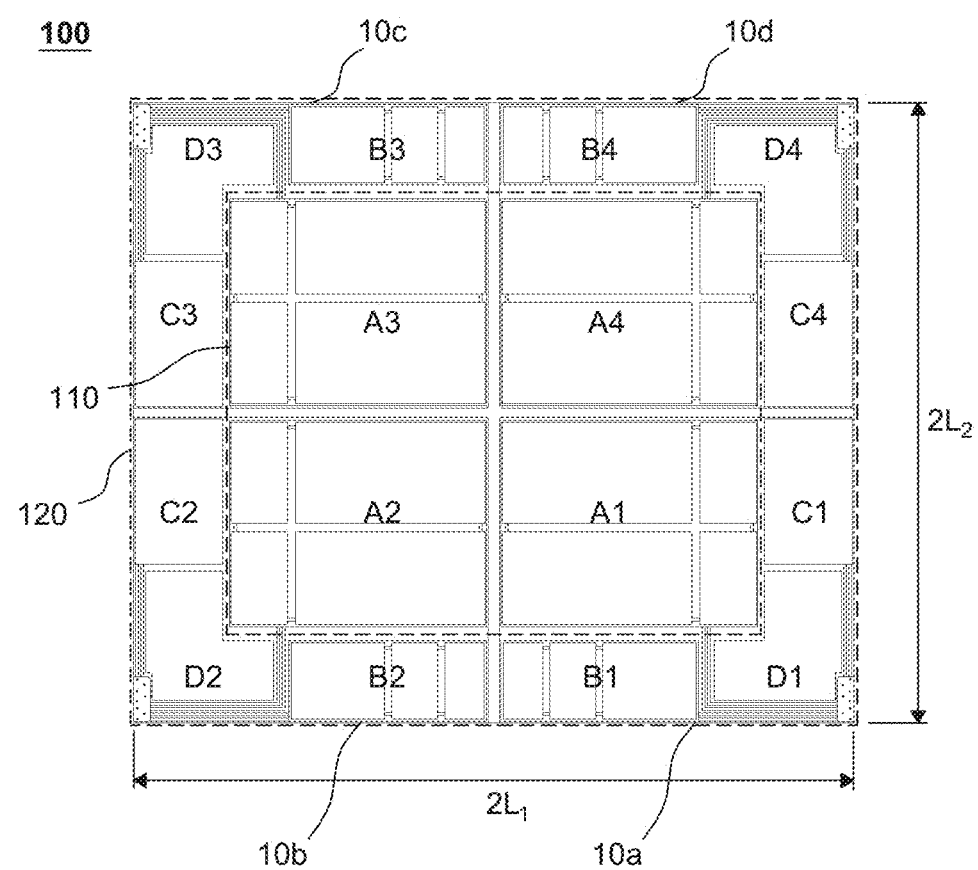
FIG. 2 exemplarily illustrates a large-area heater consisting of four unit heaters.

FIG. 2 exemplarily illustrates a large-area heater consisting of four unit heaters.

Referring to FIG. 2, the large-area heater 100 may include four unit heaters 10a, 10b, 10c, and 10d and a heating plate (not shown) having a size of having a width $2L_1$ and length $2L_2$. Each of the four unit heaters 10a, 10b, 10c, and 10d may have a plurality of heating regions symmetrical to a virtual central vertical line or horizontal line passing through the center of the large-area heater 100. For example, referring to the first unit heater 10a (same as the unit heater 10 of FIG. 1), the second unit heater 10b is symmetrical with the first unit heater 10a, and the third unit heater 10c rotates the first unit heater 10a by 180 degrees. Instead of symmetrically arranging the unit heaters 10a, 10b, 10c, and 10d, the heater pattern may be directly disposed on an insulating plate having the same size as the heating plates of width $2L_1$ and length $2L_2$. However, it is difficult to maintain the arrangement of the heater pattern during the manufacturing process, and in particular, it is difficult to secure heating/pressurization equipment capable of processing a large-area insulating plate.

The heating plate may include a central region 110 to which heat is concentrated and a peripheral region 120 surrounding the central region 110. When the four unit heaters 10a, 10b, 10c, and 10d are symmetrically arranged, the first heating regions A1, A2, A3, and A4 of each of the unit heaters 10a, 10b, 10c, and 10d heat the central region 110, and the second heating regions B1 to D4 heat peripheral region 120. In particular, the central region 110 is a region that directly transfers heat to an object to be heated, for example, an OLED substrate, and is a region requiring precise temperature uniformity. On the other hand, the peripheral region 120 may transmit heat directly to the object to be heated depending on the heating method (for example, whether there is physical contact between the heating plate and the object to be heated), but may mainly transfer heat to the central region 110 in order to reduce a temperature deviation of the central region 110.

In the large area heater 100, the ratio of the first heating regions A1, A2, A3, and A4 corresponding to the central region 110 to the entire area is relatively higher than that of the second heating regions B1 to D4 corresponding to the peripheral region 120, while the amount of heat generated per area is relatively low compared to that of the peripheral region 120. Since the peripheral region 120 surrounds the central region 110, heat generated in the peripheral region 120 tends to move to the central region 110. Accordingly, the temperature of the central region 110 may be finely controlled through the peripheral region 120. The heating regions B1 to D4 corresponding to the peripheral area 120 consist of independently power-controlled multi-zones B1 to B4 and single zones C1 to D4, and the heat amount of each zone is different from each other. Similarly, the heating regions A1 to A4 corresponding to the central region 110 are configured as multi-zones, and the amount of heat generated in each zone is different from each other. By individually raising or lowering the temperature of each zone in the peripheral region 120 according to the temperature measurement in the central region 110, the temperature deviation of the central region 110 can be maintained within a required range.

Figure 3:
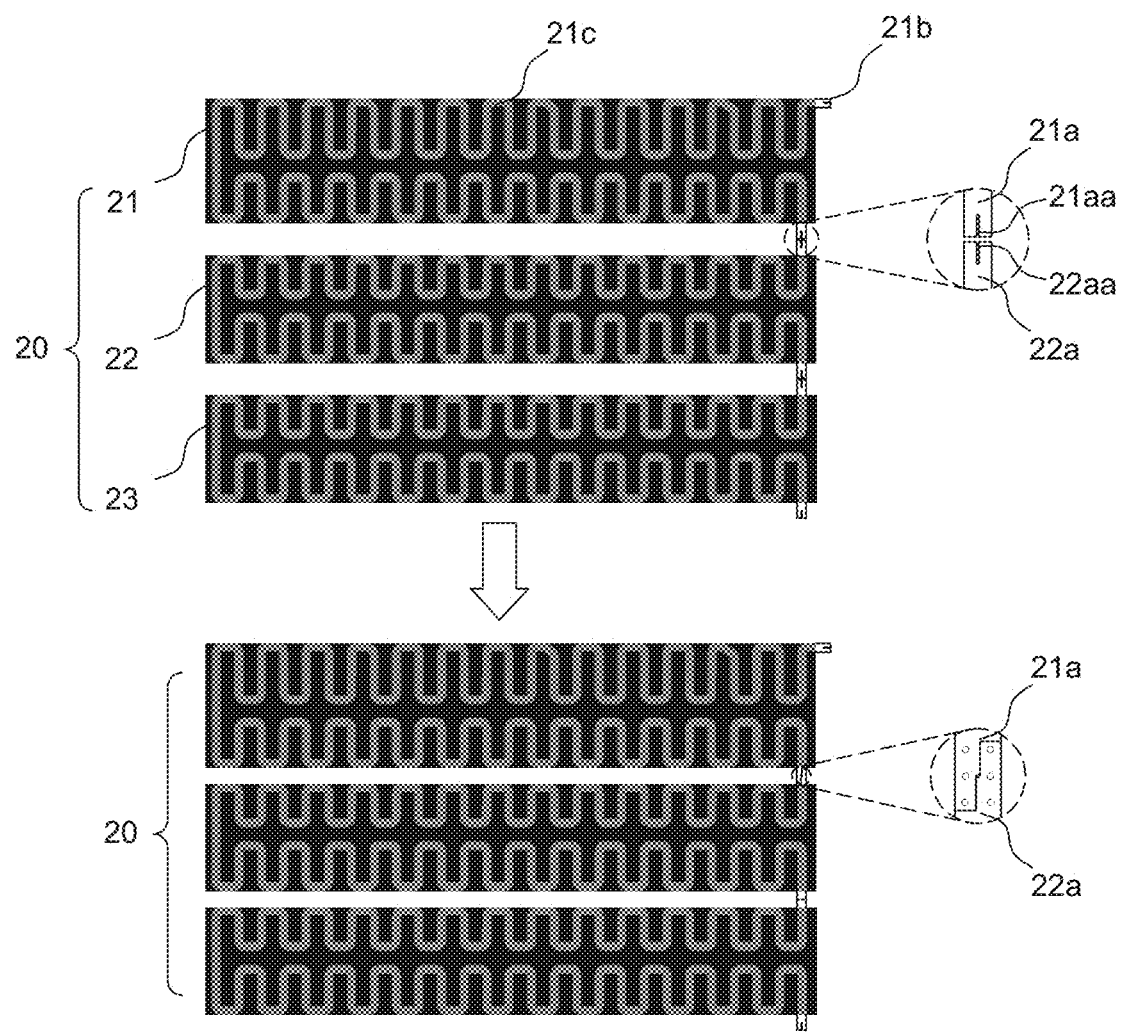
FIG. 3 exemplarily illustrates coupling sub-patterns to form a heating region.

FIG. 3 exemplarily illustrates coupling sub-patterns to form a heating region.

Referring to FIG. 3, the heater pattern 20 may be formed by coupling a plurality of sub-patterns 21 to 23. The sub-patterns 21 to 23 may be, for example, bending patterns. The sub-patterns 21 to 23 may include a pair of connectors 21a and 21b and a sub-heating element 21c bent in a zigzag shape to have a plurality of bending points between the connectors. The sub-heating element 21c may be bent substantially at 90 degrees at the bending point.

For example, the two sub-patterns 21 and 22 may be electrically coupled by fitting the connectors 21a and 22a. The connector 21a includes a slit 21aa extending from the bottom to the top, and the connector 22a includes a slit 22aa extending from the top to the bottom. For example, when fitted into the slits 21aa and 22aa, the left end of the connector 21a is located below the right end of the connector 22a, and the right end of the connector 21a is located above the left end of the connector 22a. Then, the connectors 21a and 22a may be coupled by welding or the like.

Fitting using a slit is useful for adjusting the spacing between sub-patterns and positioning the sub-patterns. The extended length of the slit formed in the connector of the two sub-patterns to be coupled may be determined according to the spacing between the sub-patterns. For example, the length of each slit may be the same or different. In addition, the slit may be formed to be able to identify up and down or left and right. For example, the slit may extend obliquely, or one end of the slit may be formed to have a different left and right shape. On the other hand, the sub-patterns may be coupled by simply overlapping the connectors.

Figure 4:
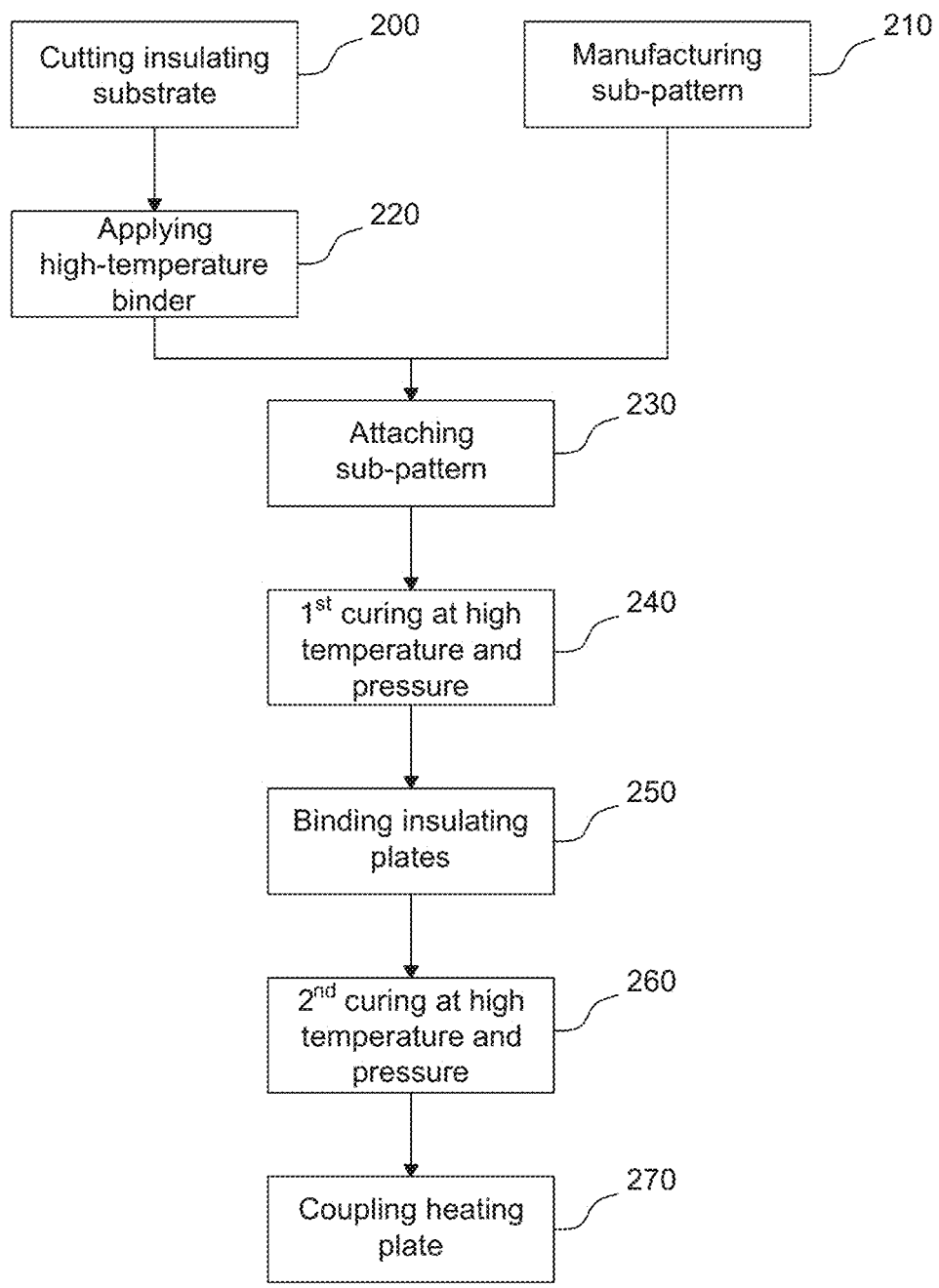
FIG. 4 exemplarily illustrates a process for manufacturing a large-area heater.

FIG. 4 exemplarily illustrates a process for manufacturing a large-area heater.

As described above, the large-area heater 100 may consist of a plurality of symmetrical unit heaters 10. The unit heater 10 may be manufactured using a completed insulating substrate having a predetermined thickness or using a prepreg for manufacturing the insulating substrate.

In step 200, the insulating substrate is cut according to the size of the unit heater 10 to manufacture an upper insulating plate and a lower insulating plate. The insulating substrate has high electrical insulation. The insulating substrate may be a mica plate, but is not limited thereto. In addition to the mica plate, a metal place coated with a material having high electrical insulation and/or high thermal conductivity such as magnesium oxide, zirconium oxide, silicon oxide, titanium oxide, aluminum nitride, aluminum oxide, etc., non-metallic plate formed of ceramic, silicon carbide, etc., or synthetic resins such as polyimide, etc., may be used. Additionally, the upper insulating plate and/or the lower insulating plate may be coated with an anti-oxidation film. The anti-oxidation film can prevent the surface of the insulating plate from being oxidized.

In step 210, a plurality of sub-patterns are manufactured. The sub-pattern may be manufactured by, for example, etching or cutting a metal thin film formed of nickel, invar, sus, silver, tungsten, molybdenum, chromium, or an alloy thereof. Since the sub-pattern is made of a thin metal film, care must be taken in handling. To solve this problem, the metal thin film may be processed while being attached to the adhesive film.

In step 220, a high-temperature binder is applied to the surface to laminate the upper insulating plate and the lower insulating plate.

In step 230, the sub-patterns are attached to the surface of the lower insulating plate. The heater pattern can be completed by welding the connectors of the attached sub-patterns. On the other hand, the sub-patterns may be welded in step 210 to attach the completed heater pattern to the surface of the lower insulating plate. Additionally, in order to protect the heater patterns and/or to increase electrical insulation, the heater patterns may be coated with an insulating film or the heater patterns may be interposed between the insulating films. The insulating layer or insulating film may be formed of a synthetic resin such as polyimide, silicone resin, epoxy resin, phenol resin, or the like.

In step 240, the lower insulating plate to which the heater pattern is attached is cured by a high-temperature and high-pressure press, and in step 250, the upper insulating plate is attached to the lower insulating plate. In step 260, the unit heater 10 consisting of the upper insulating plate, the heater pattern, and the lower insulating plate is cured by the high-temperature and high-pressure press.

In step 270, the plurality of unit heaters 10 are coupled to the heating plate to complete a large-area heater.

Figure 5:
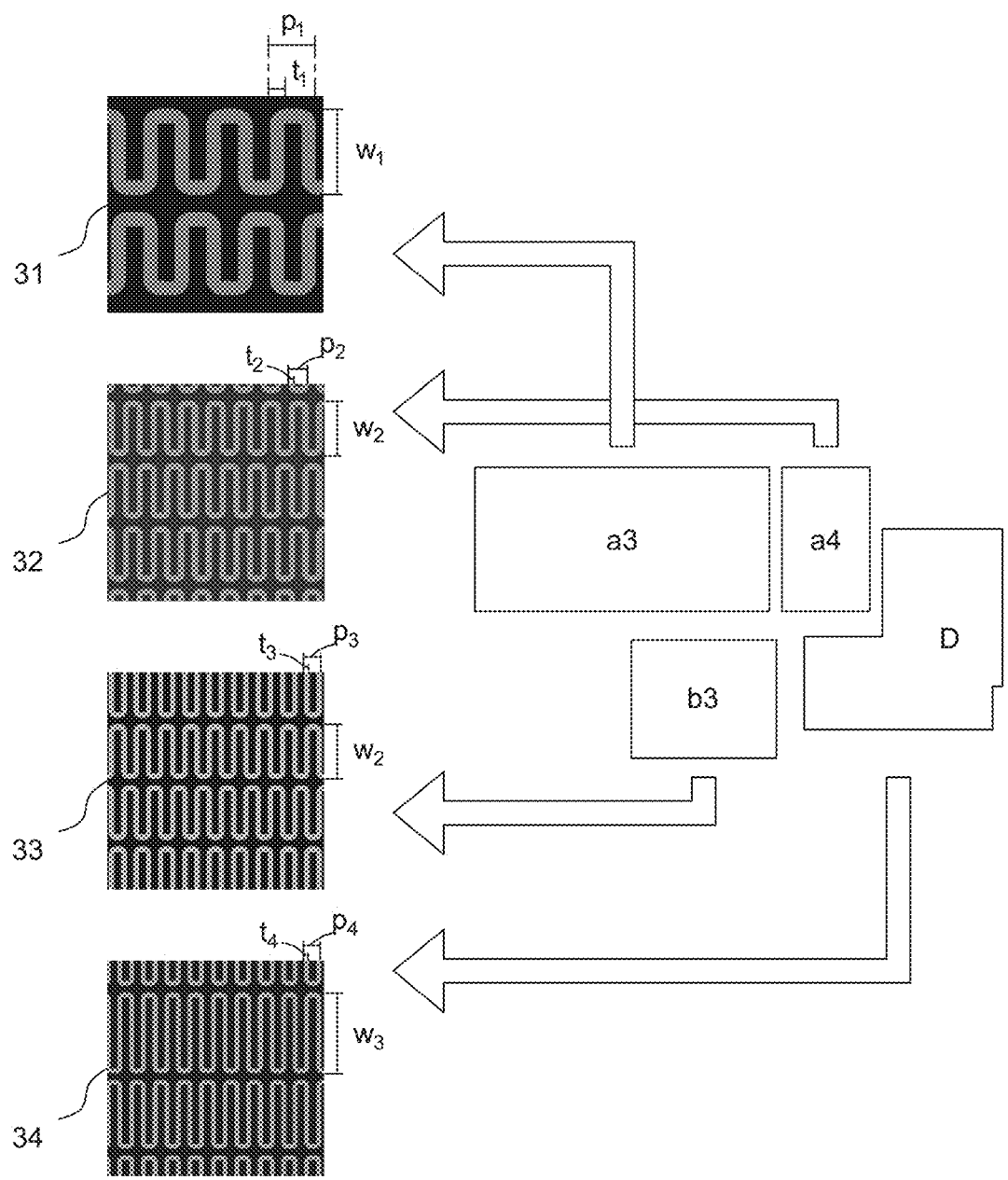
FIG. 5 exemplarily illustrates one embodiment for implementing a different amount of heat generated for each heating region.

FIG. 5 exemplarily illustrates one embodiment for implementing a different amount of heat generated for each heating region. Here, the heater pattern disposed in each zone is an example for helping understanding.

Referring to FIG. 5, the plurality of heater patterns 31 to 34 have different amounts of heat generated. To this end, a pattern density may be different for each heater pattern. The pattern density may be determined by the horizontal width p, the vertical width w, and the thickness t. The horizontal width p is the width of the heater pattern between two horizontally arranged bending points, the vertical width w is the width of the heater pattern between two vertically arranged bending points, and the thickness t is the line width of the heater pattern. The horizontal width p, the vertical width w, and the thickness t of the heater patterns 31 to 34 may be selected to implement a temperature range required by semiconductor equipment and to maintain a temperature deviation.

Meanwhile, the heater pattern may be selected in consideration of the distance from the power connection region 11. As the distance from the power connection region 11 increases, the power line 12 becomes longer and a resistance also increases, so that power loss may occur. Therefore, even when the same power is supplied to the heating region of the same area, a difference in the amounts of heat generated may occur depending on the length of the power line 12. Therefore, in the case of the heating region far from the power connection region 11, the resistance can be reduced by increasing the thickness t. On the other hand, in the case of the heating region close to the power connection region 11, the resistance due to the power line 12 is small, and thus the thickness t may be reduced. For example, the pattern density of the heating region relatively far from the power connection region 11 may be smaller than the pattern density of the region relatively close to the power connection region 11.

A heating region relatively far from the power connection region 11, for example, a3, may have a smaller amount of heat generated per unit area than an area relatively close to the power connection region 11, for example b3 or D. Accordingly, the temperature deviation required by the semiconductor manufacturing equipment can be achieved through temperature control of b3 or D having a higher pattern density.

Figure 6:
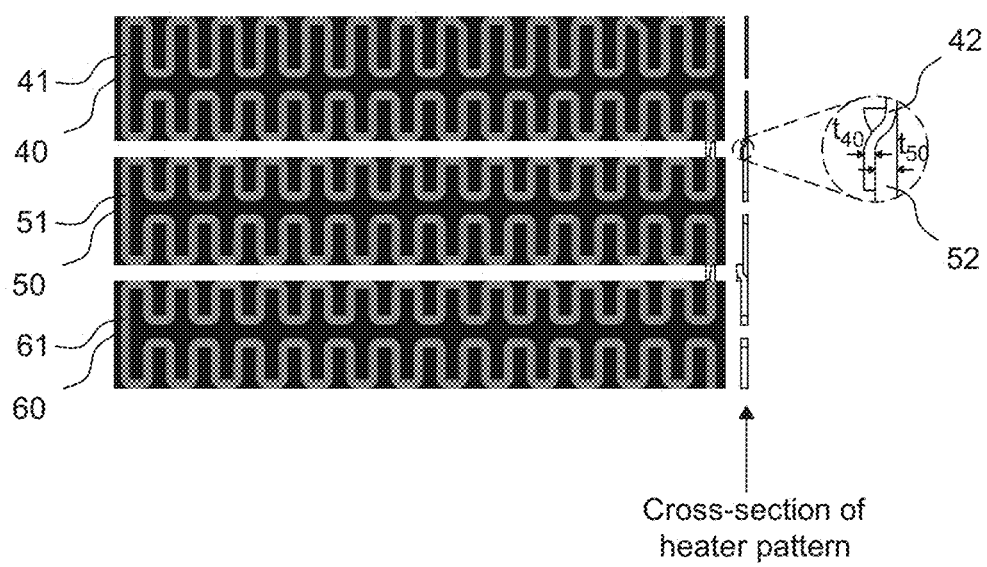
FIG. 6 exemplarily illustrates another embodiment for implementing a different amount of heat generated for each heating region.

FIG. 6 exemplarily illustrates another embodiment for implementing a different amounts of heat generated for each heating region.

Referring to FIG. 6, by varying the cross-sectional thickness of the heating elements 41, 51, and 61 for each heating region, the amount of heat generated may be different. When looking at the cross-section of the heater pattern, the thickness t50 of the cross-section of the heating element 51 of the second heater pattern 50 is greater than the thickness t40 of the cross-section of the heating element 41 of the first heater pattern 40, but the third heater pattern 50 is smaller than the cross-sectional thickness of the heating element. Assuming that the pattern density and the distance from the power connection region 11 are the same, the amount of heat generated by the heating elements 41, 51, and 61 may be different depending on the cross-sectional thickness.

The aforementioned description for the present invention is exemplary, and those skilled in the art can understand that the invention can be modified in other forms without changing the technical concept or the essential feature of the invention. Therefore, it should be understood that the embodiments described above are illustrative and non-limiting in all respects. In particular, the features of the present invention described with reference to the drawings are not limited to the structures shown in the specific drawings, and may be implemented independently or in combination with other features.

The scope of the invention is defined by the appended claims, not by the above detailed description, and it should be construed that all changes or modifications derived from the meanings and scope of the claims and equivalent concepts thereof are included in the scope of the invention.

What is claimed is:

1. A large-area heater comprising:
   a heating plate having a central region to which heat is concentrated and a peripheral region surrounding the central region; and
   a plurality of unit heaters configured for heating at least a portion of the central region and at least a portion of the peripheral region,
   wherein the plurality of unit heaters comprises
       a plurality of heating regions, each of the plurality of heating regions being configured for generating a different associated amount of heat compared to the other of the plurality of heating regions,
       a plurality of power lines configured for independently transmitting power to each of the plurality of heating regions, to cause each of the plurality of heating regions to generate the different associated amount of heat at the same time as the other of the plurality of heating regions, and
       a plurality of power connection terminal pairs disposed at one corner of the unit heater to supply power to the plurality of power lines, wherein the number of the plurality of the power connection terminal pairs corresponds to the number of the plurality of heating regions.

2. The large-area heater of claim 1, wherein the heating region comprises a single zone; and
   a multi-zone having a plurality of sub-zones generating different amounts of heat,
   wherein the plurality of sub-zones are supplied with power through one power line.

3. The large-area heater of claim 1, wherein the plurality of unit heaters comprises left, right and vertically symmetrical heating regions.

4. The large-area heater of claim 1, wherein the unit heater comprises
   a first heating region corresponding to the central region; and
   a second heating region corresponding to the peripheral region,
   wherein a pattern density of a heater pattern disposed in the first heating region is smaller than a pattern density of a heater pattern disposed in the second heating region.

5. The large-area heater of claim 1, wherein the unit heater comprises
   a first heating region corresponding to the central region; and
   a second heating region corresponding to the peripheral region,
   wherein a cross-sectional thickness of a heater pattern disposed in the first heating region is different from a cross-sectional thickness of a heater pattern disposed in the second heating region.

6. The large-area heater of claim 1, wherein the heating region comprises a heater pattern formed by electrically connecting a plurality of sub-patterns.

7. The large-area heater of claim 6, wherein the plurality of sub-patterns comprises
   a first connector and a second connector, both having slit formed thereon and
   a sub heating element bent in a zigzag shape to have a plurality of bending points between the first connector and the second connector.

8. The large-area heater of claim 1, wherein a temperature deviation of the central region is adjusted by controlling a temperature of the second heating region corresponding to the peripheral region.

* * * * *